United States Patent [19]

Hoekstra et al.

[11] Patent Number: 4,836,105
[45] Date of Patent: Jun. 6, 1989

[54] DIRECT NEGATIVE AND OFFSET MASTER PRODUCTION USING THERMAL LIFTOFF

[75] Inventors: Jan-Pieter Hoekstra, Carmel; Keith S. Pennington, Somers, both of N.Y.; Bradford J. Factor, Palo Alto, Calif.

[73] Assignee: International Business Machines Corporation, Armonk, N.Y.

[21] Appl. No.: 131,144

[22] Filed: Dec. 10, 1987

[51] Int. Cl.[4] .......................... B41N 1/08; B41C 1/10
[52] U.S. Cl. ............................... 101/453; 101/463.1; 101/401.1; 400/120; 400/241.1; 346/76 PH; 428/195; 428/484; 428/212; 428/488.1; 428/488.4; 428/913; 428/914
[58] Field of Search ............... 400/241.1, 696, 120; 101/467, 401.1, 453, 463.1; 346/76 PH; 428/195, 212, 484, 488.1, 488.4, 913, 914

[56] References Cited

U.S. PATENT DOCUMENTS

| | | | |
|---|---|---|---|
| 3,060,023 | 10/1962 | Burg | 101/467 |
| 3,267,848 | 8/1966 | Bach | 101/467 |
| 3,342,623 | 9/1967 | Dulmage | 101/467 |
| 3,483,027 | 12/1969 | Ritzerfeld | 101/401.1 |
| 3,559,576 | 2/1971 | Vrancken | 101/467 |
| 4,123,309 | 10/1978 | Perrington et al. | 156/234 |
| 4,157,412 | 6/1979 | Deneau | 428/147 |
| 4,374,691 | 2/1983 | Vanden Bergh | 156/234 |
| 4,400,100 | 8/1983 | Aviram | 400/241.1 |
| 4,453,839 | 6/1984 | Findlay | 400/696 |
| 4,525,722 | 6/1985 | Sachdev | 400/241.1 |
| 4,651,162 | 3/1987 | Nakamura | 400/696 |
| 4,672,393 | 6/1987 | Uchikata | 219/216 |
| 4,707,211 | 11/1987 | Shibata | 346/76 PH |
| 4,724,445 | 2/1988 | Amano | 400/696 |

FOREIGN PATENT DOCUMENTS

| | | | |
|---|---|---|---|
| 32181 | 7/1981 | European Pat. Off. | 400/696 |
| 2840220 | 3/1979 | Fed. Rep. of Germany | 400/696 |
| 193154 | 11/1983 | Japan | 101/467 |
| 70572 | 4/1984 | Japan | 101/467 |
| 192669 | 10/1985 | Japan | 400/241.1 |
| 1228993 | 10/1986 | Japan | 400/241.1 |
| 1287790 | 12/1986 | Japan | 400/241.1 |
| 992222 | 1/1983 | U.S.S.R. | 101/467 |

OTHER PUBLICATIONS

IBM; IBM Tech. Disc.; vol. 30, No. 3, Aug. 1987; p. 1109.

Primary Examiner—Clifford D. Crowder
Attorney, Agent, or Firm—Thomas P. Dowd

[57] ABSTRACT

An improved printing member for use in a system wherein a current source, in combination with a resistive ribbon, produces heating in selected areas of the ribbon for effecting the formation of a printing pattern on the printing member, which member is composed of a first layer, having a predetermined melting temperature, and a heat-conducting layer which adheres to the first layer below its predetermined melting temperature and which adheres to said resistive ribbon at temperatures above said predetermined melting temperature, such that, when the second layer is heated to a temperature level above the predetermined melting temperature in selected areas forming a pattern to be printed, the selected areas will adhere to the resistive ribbon and release from the first layer. Consequently, when the resistive ribbon is in contact with the heat-conductive layer while at a temperature level above the predetermined melting temperature of the first layer and is then drawn away from the heat-conductive layer, the selected areas will be removed from the heat-conductive layer forming the pattern to be printed therein.

13 Claims, 2 Drawing Sheets

DIRECT NEGATIVE AND OFFSET MASTER PRODUCTION USING THERMAL LIFTOFF

BACKGROUND OF THE INVENTION

1. Technical Field

The present invention relates to the printing or reproduction art and more particularly to the production of a member capable of acting as a direct negative or an offset master using resistive ribbon thermal transfer printing technology.

2. Description of the Prior Art

Resistive ribbon thermal transfer printing technology is well known in the art for providing high resolution, good quality printing, and is typically used in devices such as computer printers and typewriters. A common form of the technology essentially utilizes the combination of a source of current, such as a printing electrode with a set of styli, in combination with a printing ribbon having a layer of resistive material along with a layer of fusible ink. When current is applied by the electrode to the ribbon in selected areas according to a pattern to be printed localized resistive heating is produced in the selected areas of the resistive layer which causes melting of the adjacent areas in the fusible ink layer. The melted ink is then readily transferrable to a receiving medium, such as paper, to produce a printed pattern thereon. The resistive layer is commonly a carbon or graphite-filled polymer, such as a polycarbonate. A thin current return layer may also be provided as an intermediate layer in the ribbon consisting of a metal such as aluminum. Currents of approximately 20-30 milliamps are used to produce temperatures of about 100° C. which typically melt the thermally fusible ink. Various embodiments involving resistive ribbon thermal transfer printing are described in detail in U.S. Pat. Nos. 3,744,611, 4,098,117, 4,400,100, 4,491,431 and 4,491,432 and an example of commercially available printers utilizing the technology are those sold by IBM Corporation under the name QUIETWRITER™.

A related technology that is also well known is electroerosion printing which is suitable for producing direct negatives and direct offset masters for use in lithography. Specific embodiments utilizing this technology may be found in U.S. Pat. Nos. 2,983,221, 3,786,518, 3,861,952, 4,399,758 and 4,086,853. In this technology the recording medium is typically a member or sheet composed of a support layer and a thin conductive layer. The support layer may be of paper, or a polyester such as MYLAR™, while the thin conductive layer is of a suitable metal such as aluminum. The pattern to be printed is produced using an electrode to remove portions of the thin aluminum layer by means of an electric arc. More particularly, a printing head which may be composed of multiple styli, typically of tungsten wire of diameters of 0.3-0.5 mil, is swept across the surface of the recording medium while maintaining good electrical contact between the tips of the styli and the conductive layer. Timed electrical pulses are applied to appropriate styli when passing over areas of the surface to be printed to produce arcing in a given pattern between the energized styli and the aluminum layer. The magnitude of the arcing is sufficient to cause local heating and removal of the aluminum in the given pattern by disintegration or vaporization.

To prevent scratching of the aluminum layer in areas where no arc is applied and to minimize head wear and fouling, the recording medium is normally provided with a base layer between the supporting substrate and the thin metal layer as well as an overlayer on the latter. Recording media of this type, depending upon the properties of the various layers, may be used to produce direct negatives and direct offset masters suitable for use in lithography. For example, to produce a direct negative, a transparent polymer support layer with a thin aluminum layer directly deposited thereon may be used as a recording medium and the electroerosion writing is used for producing a pattern in the aluminum layer. Since the substrate is transparent and the aluminum layer is reflective to light, the electroerosion writing will produce the required light transparent and light opaque regions in the medium needed to make a negative. Such a negative can be employed in a plate making machine to make a "master" by contact printing such as used in offset photolithography.

On the other hand, electroerosion printing can also be used to simplify the process for making masters or plates in conventional offset lithography. In such an application the recording medium is typically composed of: a support layer; a base layer, which is hydrophobic; an aluminum layer; and an optional overlayer. When the aluminum layer is electroeroded and the overlayer removed, regions of the alminum layer (unwritten areas) and of the base layer (written areas) will be exposed on the surface of the medium. As aluminum is hydrophilic, water will be attracted to the aluminum surfaces or unwritten areas while organic inks are repelled thereby. The written areas composed of the hydrophobic base layer surfaces will repel water but accept organic-based inks. The recording medium thus has become a direct master since the pattern of the information to be printed has been mapped onto the medium's surface in the form of regions having appropriate affinity to water and ink.

As noted, the fundamental recording medium is provided with a base layer and an overlayer to deal with the problems of the scratching of the aluminum layer and wear and fouling of the printing head. Typically, the base layer is a hard layer consisting of hard particles embedded in a suitable binder such as silica in a crosslinked cellulose binder. The overlayer is typically a lubricating, protective layer, comprised of a polymer including a solid lubricant, such as graphite in a cellulosic binder. However, if the problem of scratching were not present the fundamental recording medium composed of the substrate and aluminum layer combination could itself be used for direct master and direct negative applications. For example, a clear polymer sheet typically of polyesters could be used as the substrate since it would be transparent to light and hydrophobic, and aluminum as the metal layer would be opaque and hydrophilic, so that the resulting electroeroded medium would be suitable for use as either a direct negative or a direct master.

The present invention involves a system and technique which obviates the need for the base layer and overlayer and provides an improved recording medium suitable for use as a direct negative or direct master.

SUMMARY OF THE INVENTION

The present invention takes advantage of resistive ribbon thermal transfer technology to provide a direct negative or direct master recording medium, which is capable of producing high resolution and good quality printing, and which is produced in a rapid and efficient manner.

The improved recording medium is in the form of a printing member composed essentially of two layers bonded to each other, one of a heat-conductive material, such as a metal, and the other of a heat-softenable material such as a polyester, polyimide, or wax. A polymer substrate may also be provided for the two layers for support and strength.

This layered printing member is used in combination with a resistive ribbon, which may or may not be included as a layer on the printing member, and a suitable electrical printing head such as one having a matrix of styli supplied with current in patterns corresponding to patterns desired to be printed. When the resistive ribbon is brought into contact with the heat-conducting metal or transfer layer and a current is introduced by an electrode stylus into the resistive ribbon heating of the ribbon in the region under the electrode stylus results. The heat produced in the ribbon will be conducted by the contacting metal layer to an adjacent region in the layer of heat-softenable material or thermal layer beneath the metal layer. By appropriately predetermining the softening or melting temperatures of the resistive ribbon and the heat-softenable layer, selective removal of prescribed regions of the metal layer may be accomplished in the following manner. With the resistive ribbon in contact with the surface of the metal layer, an appropriate current is introduced into the ribbon by the electrode. This current causes heating in the area or region of the ribbon immediately under the electrode and concentrated at the interface with the metal layer. Heating is carried out until the temperature increases to the point where the surface of the ribbon adheres to that of the metal, by melting or otherwise, at that area of the interface beneath the electrode. The heat from the ribbon is also conducted through the metal layer and softens the material in the thermal layer on the underside of the metal layer whereupon the adhesive bond between these two layers is weakened or broken at the adjacent interface. If the ribbon is then removed from contact with the metal layer, a region with a surface area approximately the size of that of the electrode will be lifted out of the metal layer as a result of the adherence of the ribbon to the metal in that area and release of the metal by the thermal layer. In this manner, a pattern may be formed in the metal layer.

The resulting printing member is then suitable for use as a master plate for master offset printing by choosing materials with opposite affinities for the metal and thermal layers. For example, a metal may be chosen that is hydrophilic, so that printing ink will not adhere to the areas where the metal remains, while the thermal layer is chosen to be of a material that is hydrophobic so that the areas where the metal has been removed are characteristically hydrophobic and will be wetted by the oil-based ink. In addition, if the thermal layer is of a transparent material this printing member may be used as a direct negative by passing light through the areas from which the metal has been removed onto a lithographic printing plate or other photoreceptive medium for utilization in making a conventional offset printing master plate or for other purposes such as the generation of overhead foils.

It will be seen that by selecting the material compositions of the resistive ribbon and the thermal layer such that there respective melting points are predetermined to be sufficiently different, and by heating the ribbon to an appropriate temperature level, the ribbon/metal interface becomes adherent while the metal/thermal layer bond is released by softening of the heat-softenable material, and a desired printing member can be obtained, upon withdrawing of the resistive ribbon from contact with the metal layer, by lifting off the portions of the metal which have adhered to the ribbon in a pattern to be printed. To improve the tensile strength of the components, the resistive ribbon, consisting of a resistive carbon-loaded polymer, may be coated with a thin aluminum film covered with a high temperature adhesive layer, and the printing member may be provided with an additional substrate layer as already noted.

DETAILED DESCRIPTION OF THE INVENTION

Figure 1:
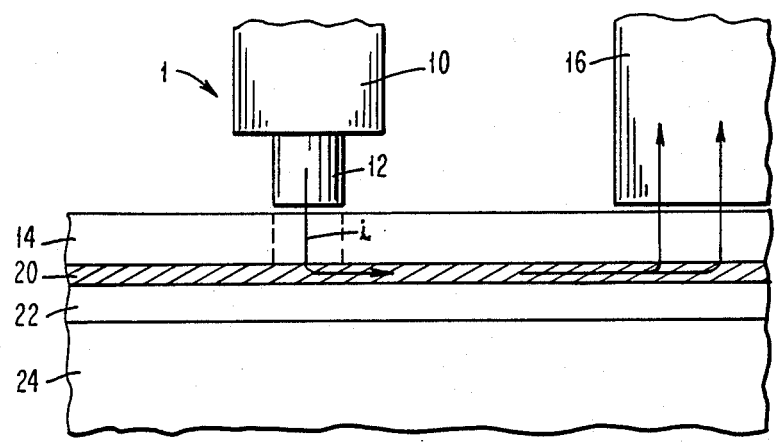
FIG. 1 is a diagrammatic view illustrating the arrangement of an electrode head, a resistive ribbon and a printing member during the application of heating current in accordance with the present invention.

The present invention involves a system and method utilizing an improved recording medium, a resistive ribbon, and a source of heating current, all of which are shown in their operable combination in FIG. 1. More particularly, the source of current may be a printing head electrode 10 having a matrix of styli (one of which 12 is shown) that selectively introduce a current i into a resistive ribbon 14. A return or ground element 16 is provided to complete a directed path for the current i when timed electrical pulses are applied to the appropriate styli by a suitable energizing or activating source 1. The resistive ribbon 14, which may typically be of a carbon or a graphite-filled polymer such as a polycarbonate, is disposed with one side in contact with both the stylus 12 and ground element 16, although the latter may be otherwise located. The recording medium is in the form of a printing member 18 composed of a transfer layer 20 and a thermal or release layer 22 having an initial heat-sensitive bond between them. A suitable supporting layer or substrate 24 may also be provided on the recording medium beneath the thermal layer 22 for strengthening purposes, but is not essential to the operation of the invention.

The transfer layer 20 is of a heat-conductive material such as a metal, for example, aluminum, and the thermal layer 22 is of a heat-softenable material such as a suitable polymer, for example, polyester or polymide or wax. The substrate 24 may be of a polymer such as MYLAR or other suitable material offering tensile strength to the printing member 18.

Figure 2:
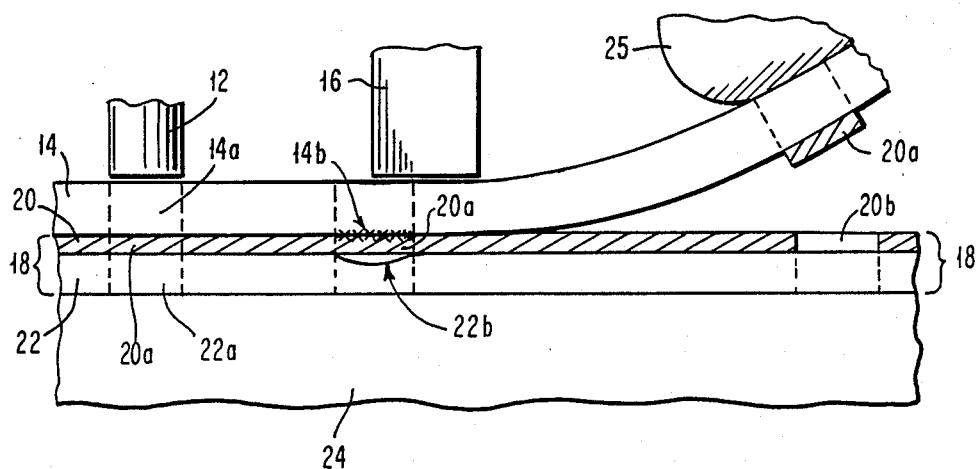
FIG. 2 is a diagrammatic view showing the liftoff of the resistive ribbon from the printing member following the heating illustrated in FIG. 1.
Figure 3:
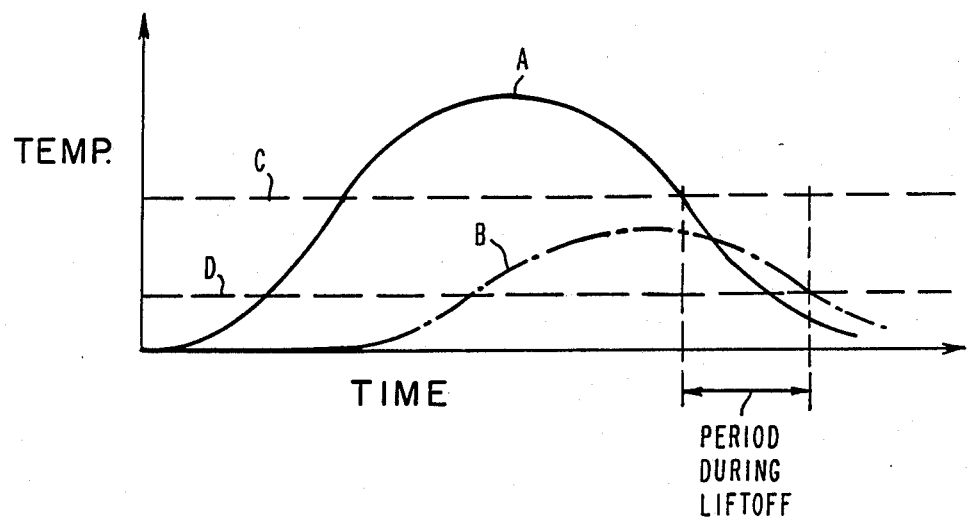
FIG. 3 is a plot of the temperature profiles involved in the heating illustrated in FIG. 1 and indicating their relationships to the predetermined softening temperatures of the resistive ribbon and thermal layer material during the ribbon liftoff of FIG. 2.

The process by which a printing pattern is formed in the transfer layer 20 is illustrated in FIG. 2. With the electrode or stylus 12 and ground element 16 in electrical contact with one side of the resistive ribbon 14, a suitable current i is introduced into the resistive ribbon 14. The conductive metal layer 20, in pressure contact with, or minimally bonded to, the opposite side of the resistive ribbon 14, acts as a convenient low-resistance, portion of the current path between the electrodes. The current i in passing from the stylus 12 to the transfer layer 20 passes through the resistive ribbon in the region or area 14a lying between them. The resistive nature of the ribbon 14 causes heating in the region 14a and particularly at the interface 14b between the ribbon and the metal. As the imposition of the current i will normally be for a short period, the heating of the region 14a at the interface 14b will have a temperature profile A such as shown by the plot of temperature versus time in FIG. 3. The transfer layer 20 being of a highly heat-conductive metal will conduct heat from the region 14a in the resistive ribbon 14 to a region 22a in the thermal layer 22 disposed in comparatively tightly bonded contact with the opposite side of the metal layer 20 from that contacted by region 14a. The temperature profile of the heating in thermal layer region 22a will be shown as at B in FIG. 3.

In accordance with the invention, the compositions of the resistive ribbon 14 and thermal layer 22 are chosen so that each is predetermined to have a different softening or melting temperature. By "softening or melting temperature" here is meant a temperature at which the respective materials undergo a change in their affinity or condition of attachment to the metal of the transfer layer, which change may be due to melting or some other phenomenon effecting the adherence of the materials. The softening temperature of the resistive ribbon 14 is predetermined to be at a level C shown in FIG. 3, while the softening temperature of the thermal layer 22 is selected to be at a lower level D. Under these prescribed conditions it will be seen from the relationship diagrammed in FIG. 3 that the following phenomena will occur during the application of an appropriate current to the composite layers of the resistive ribbon 14 and the recording medium 18. The temperature level within the resistive ribbon region 14a will increase in accordance with the curve A and in time will exceed the level C of the softening temperature of the resistive ribbon 14. During the time period that the softening temperature C of the resistive ribbon 14 is exceeded, the resistive ribbon material will soften or melt, i.e., change its affinity to the metal layer 20, in the region 14a. This change in state in the resistive ribbon material, which need only be made to occur at the interface 14b with the metal layer 20, will increase the adherence of the two contacting surfaces to each other, initiating a bond, or increasing the bond, between them in that region. The heat transferred through the intermediate region 20a of metal layer 20 will increase the temperture in the thermal layer 22, in accordance with profile B, to a level in excess of the softening or melting temperature D of the thermal layer in the region 22a. Softening of the thermal layer 22 will decrease or break the prearranged adhesive bond between the metal transfer layer 20 and thermal layer 22 at the interface 22b with the region 22a. Under the conditions thus created, the region 20a in the metal layer becomes more strongly bonded to the resistive ribbon 14 than to the thermal layer 22 while the remainder of the metal layer has the opposite affinity.

At this time, the appropriate conditions having been established, the resistive ribbon 14 is drawn away from the recording medium 18 by an appropriate device 25, such as the ribbon transporter of a QUIETWRITER printer, as shown to the right in FIG. 2. Due to the differential bonding created at the region 20a of the metal layer 20, by appropriate preselection of the respective adhering and softening temperatures C and D of the resistive ribbon and thermal layer and the temperature profiles A and B respectively produced in the resistive ribbon and thermal layer by the predetermined imposition of the heating current i, withdrawal of the resistive ribbon 14 from the surface of the metal layer 20 will cause the region 20a to be lifted off or removed from metal layer 20 leaving a void 20b. Accordingly, by the suitable application of heating current in desired patterns through the electrode styli (12), patterns may be formed by voids in the transfer layer 20 in accordance with information to be printed. The remaining composite (20, 22), after removal of the resistive ribbon 14, thus amounts to a printing member 18 with the matter to be printed in the form of a pattern of voids on its surface.

The resulting printing member 18 is then suitable for use as a master plate for master offset printing if the materials of the transfer and thermal layers have been selected to be respectively hydrophilic and hydrophobic, or vice versa. For example, by choosing a metal for the transfer layer 20 such as aluminum which is hydrophilic, printing ink will not adhere to the areas where the metal remains, while if the thermal layer 22 is chosen to be of a material such as wax that is hydrophobic, the areas where the metal has been removed are characteristically hydrophobic and will be wetted by the oil-based ink so that a lithographic master results. Further, if the thermal layer is of a transparent material, the printing member 18 will be capable of use as a direct negative by passing light through the areas from which the metal has been removed onto a lithographic printing plate or other photoreceptive medium, which may then be suitable for utilization in conventional offset printing or for other purposes such as the generation of the overhead foils.

In order to achieve the desired softening of the materials and adherence exchange to produce the pattern liftoff in accordance with the invention, it will be seen that materials must be chosen for the various layers with appropriate characteristics. The softening or melting temperatures of the resistive ribbon and thermal layer materials must be predetermined and the current magnitude necessary to produce the required heating must be evaluated. While a variety of combinations of materials and current magnitudes may be found to produce the desired results, as will be appreciated by those of skill in the art, some preferred embodiments are as follows.

The metal layer 20 is preferably aluminum of a thickness in the range from about 500 to 1000 Angstroms. If a hydrophobic metal layer is desired, copper is recommended, and various other metals will be found suitable in this application, depending on whether a hydrophilic or hydrophobic material is to be used.

The resistive ribbon 14 may be of a commercially-obtainable type composed of graphite-filled polymer, such as that used with the previously-mentioned QUIETWRITER printer, but with the metal and ink layers removed. The ribbon material should begin to adhere to the surface of the metal layer at a temperature of about 120° C. to 150° C.

The thermal or release layer 22 is preferably composed of an appropriate mixture of toluene, paraffin wax, polymerized hydrocarbon, and an ethlene/vinyl acetate copolymer in the proper proportions so as to begin to soften and lose its adherence to the metal layer at a temperature level of about 100° C. The preparation of the correct mixtures and compositions for various desired characteristics is well within the purview of those skilled in the art. Similarly, the selection of appropriate polyester and polyimide materials for their hydrophilic and hydrophobic characteristics as well as their softening temperatures will be a comparatively simple matter for the skilled artisan. Suitable materials for the substrate are MYLAR, or paper, or the like.

Figure 4:
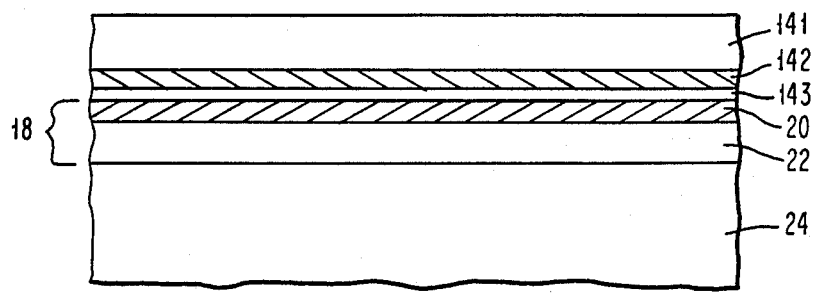
FIG. 4 illustrates an alternate embodiment of the resistive ribbon and printing member of the present invention.

An alternate embodiment of the layered combination is shown in FIG. 4 and involves a modified resistive ribbon approaching the commercially-obtainable form in consisting of a resistive carbon-loaded polymer 141 coated with a thin aluminum film 142. However, in this embodiment the heat-fusible ink layer of the commercial ribbon may be replaced with a suitable adhesive layer 143. The adhesive material will have the requisite adherence characteristics and may have the same constituents as the thermal layer material, but, of course, in different proportions to increase its melting temperature. Although the presence of the thin aluminum layer 142 in this composite resistive ribbon will decrease the overall thermal efficiency of the combination, the film will offer advantages in those applications wherein the ribbon tensile strength is of importance. The layered combination may be produced as a composite with the resistive ribbon attached to the printing member for use in a suitable printing device, or the ribbon and member may be separately mounted in the device and the two brought together at the printing head. In these embodiments the ground element 16 may be disposed in contact with the edge of the layered combination or other convenient location.

It will thus be seen that an improved printing member is herein disclosed which when used with an appropriate combination of elements in a resistive ribbon thermal transfer system will become a recording medium capable of utilization as a direct negative or direct master in offset lithography or related applications.

Having thus described our invention what we claim as new and desire to secure as Letters Patent, is:

1. A printing member for use in a system of the type wherein a current source in combination with a resistive ribbon produces heating in selected regions in said ribbon for effecting the formation of printing patterns on the printing member, said printing member comprising:
   a first layer of a material selected to have a melting temperature below that of said resistive ribbon; and
   a second layer on said first layer comprising heat conductive means for receiving heat from said resistive ribbon in a manner defining a pattern to be printed, said second layer being of a material selected to be adhering to said first layer when at temperatures below, and releasing from said first layer when at temperatures above, the melting temperature of said resistive ribbon, and to be adhering to said resistive ribbon at temperatures above said melting temperature such that when said second layer is heated to a temperature level above said resistive ribbon melting temperature in selected regions forming a pattern to be printed, said selected regions will adhere to said resistive ribbon and release from said first layer, whereby when said resistive ribbon is in contact with said second layer while at said temperature level above said melting temperature and is then drawn away from said second layer said selected regions will be removed from said heat conductive means forming the pattern to be printed therein.

2. A printing member as in claim 1 wherein said second layer is of aluminum.

3. A printing member as in claim 1 wherein said first layer is of a material comprising a mixture of toluene, paraffin wax, polymerized hydrocarbon, and an ethylene/vinyl acetate copolymer in proportions so as to begin to soften and lose its adherence to said second layer at a temperature level of about 100° C.

4. A printing member as in claim 1 further comprising a substrate layer in contact with said first layer on the side opposite said second layer.

5. A printing member as in claim 1 wherein said resistive ribbon is included as a layer thereof in contact with said second layer.

6. A printing member as in claim 5 wherein said resistive ribbon is of a material having a softening temperature in the range from about 120° C. to 150° C.

7. A printing member as in claim 5 wherein said resistive ribbon comprises: a layer of a resistive carbon-loaded polymer; a thin aluminum film coated on said polymer layer; and an adhesive layer on said film for contacting said second layer.

8. A printing member as in claim 1 wherein one of said first and second layers is of a material that is hydrophilic and the other is of a material that is hydrophobic.

9. A printing member as in claim 1 wherein said first layer is of a material that is transparent.

10. A printing or reproduction system comprising the combination of:
   a printing member comprising:
      a first layer having a predetermined softening temperature; and
      a second layer having one surface in contact with said first layer and comprising heat conductive means
      for defining a pattern to be printed and adhering to said first
      layer at temperatures below said predetermined softening temperature;
   resistive ribbon means, in contact with the other surface of said second layer, for adhering to said second layer at an adhering temperature above said predetermined softening temperature;
   heating means for producing heating in selected regions of said resistive ribbon means in the form of a pattern to be printed, which heating is sufficient to produce a first temperature level above said adhering temperature in said selected regions of said ribbon means and, by conduction through said heat conductive means, a second temperature level above said predetermined softening temperature in regions of said first layer adjacent to said selected regions;
   means for activating said heating means to produce said first and second temperature levels respectively in said selected and adjacent regions; and
   means for drawing said resistive ribbon means away from said other surface of said second layer when said selected and adjacent regions are respectively at said first and second temperature levels, whereupon said selected regions will adhere to said second layer and said adjacent regions will release from said second layer resulting in lifting of the intermediate regions out of said heat conducting means forming the pattern to be printed therein, whereby printing patterns are formed on said printing member.

11. A system as in claim 10 wherein said first layer is of a material comprising a mixture of toluene, paraffin wax, polymerized hydrocarbon, and an ethylene/vinyl acetate copolymer in proportions so as to begin to soften and lose its adherence to said second layer at a temperature level of about 100° C.

12. A system as in claim 10 wherein said resistive ribbon is of a material having a softening temperature in the range from about 120° C. to 150° C.

13. A system as in claim 10 wherein one of said first and second layers is of a material that is hydrophilic and the other is of a material that is hydrophobic.

* * * * *